(12) United States Patent
Ives et al.

(10) Patent No.: US 7,026,827 B2
(45) Date of Patent: Apr. 11, 2006

(54) PORTABLE CALIBRATION UNIT FOR TEST EQUIPMENT

(75) Inventors: Fred H. Ives, Veradal, WA (US); David L. Platt, Veradale, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 166 days.

(21) Appl. No.: 10/675,103

(22) Filed: Sep. 30, 2003

(65) Prior Publication Data

US 2005/0080577 A1   Apr. 14, 2005

(51) Int. Cl.
*G01R 35/00* (2006.01)
*G06F 19/00* (2006.01)

(52) U.S. Cl. .................. 324/601; 324/74; 324/130; 702/85; 73/1.01

(58) Field of Classification Search ............... 702/85, 702/107, 122; 324/74, 202, 601, 619; 73/1.61, 73/1.01
See application file for complete search history.

(56) References Cited

U.S. PATENT DOCUMENTS

| 4,403,297 | A | * | 9/1983 | Tivy | 702/122 |
| 4,569,221 | A | * | 2/1986 | Snook, Jr. | 73/1.61 |
| 4,816,767 | A | * | 3/1989 | Cannon et al. | 324/601 |
| 5,248,933 | A | * | 9/1993 | Venditti | 324/74 |

* cited by examiner

*Primary Examiner*—Vincent Q. Nguyen

(57) ABSTRACT

A portable calibration unit for calibrating test equipment is disclosed that may incorporate a communication interface for connecting to a computer embedded within the test equipment, a variable signal source for producing a test signal, a processor in communication with the computer for controlling the variable signal source, and a test interface for communicating the test signal to the test equipment.

27 Claims, 3 Drawing Sheets

PORTABLE CALIBRATION UNIT FOR TEST EQUIPMENT

TECHNICAL FIELD

The present invention relates, in general, to testing equipment, and more specifically to a portable calibration unit for test equipment.

BACKGROUND OF THE INVENTION

In various manufacturing processes, such as the manufacture of radio frequency (RF) equipment, cell phones, and the like, testing equipment is typically included at various stages of the process to test the operation of each item produced. This testing equipment may either make up a part of the production line or may be a portable or transportable system maintained in proximity to the production line. While the use of testing equipment helps to ensure that the manufactured items operate correctly within a given set of parameters, the testing performed would be of little use if the testing equipment was not, itself, reliably accurate. Therefore, additional verification equipment is typically used to test the main-line testing equipment.

Test systems, like other electronic equipment, are susceptible to anomalies such as electronic drift, wear in cables or connectors, and the like, as time passes. Therefore, such equipment is routinely checked to verify its accuracy. By periodically checking the test equipment, electronic and physical faults, such as worn cables, connectors, or the like, may be fixed or adjusted. Furthermore, because environmental conditions play an important role in the testing of the manufactured items, the main test equipment is typically checked in place. Currently, verification equipment is routinely placed on a mobile test cart that may be moved around the factory floor to check the various test equipment. The group of equipment on the cart is sometimes referred to as a calibration cart. A calibration cart generally includes a source and power meter with a system controller, various couplers to connect to the different inputs or outputs of the test set, and at least one computers to run the testing and calibration applications for the calibration cart hardware. Therefore, a verification application on a calibration cart computer may cause a source signal to be transmitted to the input of the test set or test equipment to check various elements, such as the insertion loss of the cables, the test set set-up, all of the switches that would be found between the test set, the manufactured items, and/or other such elements. On a typical production line, there are many different cables, switch boxes, adapters, and the like that make up a part of the overall testing system. The calibration cart is generally moved down the line to test each of these components. Power is typically supplied to a cart through an alternating current (AC) power source. It may also include an uninterruptible power supply (UPS) to maintain power in the equipment as it is being moved from station to station and AC outlet to AC outlet.

While providing a means at verifying the accuracy and integrity of testing equipment, one of the main problems with the calibration cart is the inconvenience of moving the cart around and plugging it in repeatedly. Moreover, current calibration carts are generally custom built to a particular production line, running a particular testing format. It then becomes impracticable or expensive to create another calibration cart to verify or calibrate test equipment running the different format. For applications in the cellular communications industry, there are several different formats, sometimes even within the same phone. Further, as product prices fall and the margins of profit narrow, the cart method of verifying test sets and test equipment provides a relatively expensive solution to a systematic part of the manufacturing process.

BRIEF SUMMARY OF THE INVENTION

Representative embodiments of the present test equipment calibration system are directed to a portable calibration unit for calibrating test equipment that may incorporate a communication interface for connecting to a computer embedded within the test equipment, a variable signal source for producing a test signal, a processor in communication with the computer for controlling the variable signal source, and a test interface for communicating the test signal to the test equipment.

Additional representative embodiments of the present test equipment calibration system are directed to a method for portably calibrating a test system comprising establishing a communication link between a calibration pod and a personal computer (PC) embedded within the test system, generating a test signal within the calibration pod responsive to a digital signal received from the PC, and transmitting the test signal to a test subject of the test system.

Further representative embodiments of the present test equipment calibration system are directed to a system for calibrating test equipment comprising a calibration unit having an interface for connecting to a personal computer (PC) embedded in the test equipment, a processor within the calibration unit, the processor configured to receive digital control signals from the PC, a signal source for generating a test signal responsive to the digital control signals, and a test connection for connecting the calibration unit to the test equipment, wherein the test signal is transmitted to the test equipment using the test connection.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
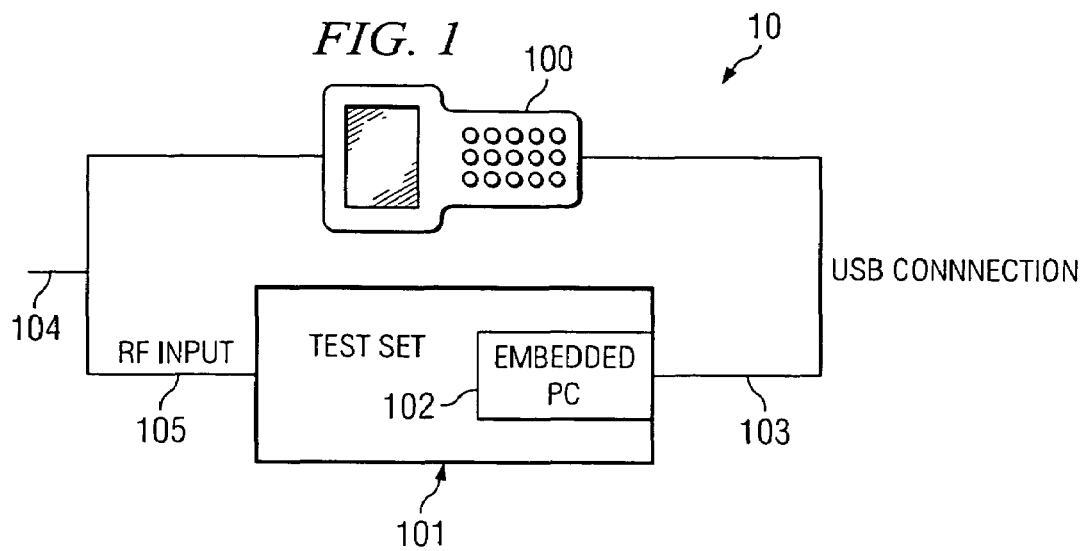
FIG. 1 is a block diagram illustrating a calibration pod configured according to one embodiment of the system described herein connected to a test set.

FIG. 1 is a block diagram illustrating calibration pod 100 configured according to one embodiment of the system described herein connected to test set 101. Test set 101 is configured with embedded PC 102 for running applications used in testing the integrity and accuracy of the manufactured items. Calibration pod 100 is implemented in a small or handheld unit complete with a standard set of connectors that may be used to connect to different parts of test set 101 or to the manufactured item. Calibration pod 100 may also include system connectors, such as USB connection 103, to facilitate connection with embedded PC 102. Because standard USB connections are capable of supplying up to 5 Volts at 100 milliamps from the host device, calibration pod 100 may be powered completely by test set 101 through USB connection 103, thus, in some embodiments, relieving the need for an external AC power source.

In operation, after successful communication on the initiation of USB connection 103, embedded PC 102 recognizes calibration pod 100 and runs a verification application native within a memory of embedded PC 102 that controls the verification processes of calibration pod 100. The verification application or instruction logic may be stored in firmware, random access memory (RAM), flash memory, disk drives, or other such non-volatile memory. Because the verification logic is maintained on PC 102 within test set 101, calibration pod does not need to have a high performance processor or computer, as is found in the calibration carts, and, may then be smaller in size. Moreover, different formats or systems may be tested using calibration pod 100 simply by running a different verification application.

PC 102 executes the verification application upon recognition of calibration pod 100, or upon a user-selection in response to a prompt displayed after the connection of calibration pod 100. The verification application controls the specific test signals and measurements performed by calibration pod 100. Test signals issued over link 104 into RF input 105 may then test many different aspects and features of test set 101. The output levels or verification results may then be read for display to the user technician.

Figure 2:
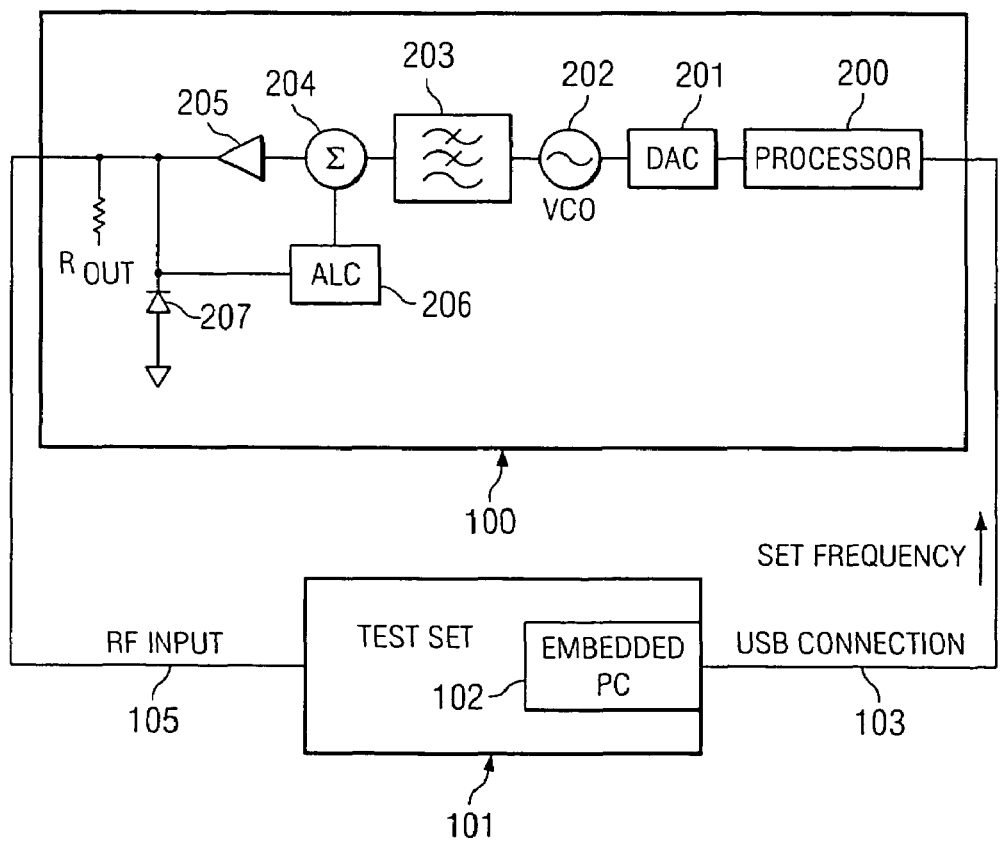
FIG. 2 is a block diagram illustrating another embodiment of a calibration pod configured according to the teachings herein.

FIG. 2 is a block diagram illustrating another embodiment of calibration pod 100. Calibration pod 100 includes processor 200, which not only manages USB connection 103, but also assists in controlling the verification and calibration process. The embodiment of calibration pod 100 shown in FIG. 1 used the measurement facilities of test set 101 to sense and detect the levels of signals delivered by calibration pod 100. The embodiment shown in FIG. 2 includes digital to analog converter (DAC) 201 connected between processor 200 and voltage controlled oscillator (VCO) 202. Normal verification and calibration process may check the test subjects over various frequencies. In order to implement such multi-frequency testing, the verification application being run from PC 102 may signal VCO 202 through processor 200 and, thereafter, through DAC 201, to vary the signal produced at VCO 202. In this manner, the verification application may transmit multi-frequency test signals to test set 101. Various types of VCOs may be used to implement VCO 202. One example may be an octave VCO, which tunes over octaves and is typically useful in suppressing certain types of noise.

In operation, as calibration pod 100 is connected to embedded PC 102 through USB connection 103, the verification application run by PC 102 may set the desired test frequency to be generated from calibration pod 100. For example, some selected embodiments designed to test Personal Communication Service (PCS) radios in the United States may implement VCO 202 to produce test signals in the range of 850–1900 MHz, which covers the cellular communication bands in the United States. Signals from PC 102 direct what frequency at which to set VCO 202 according to what cellular signal service is currently being tested. Filter bank 203 is also included in calibration pod 100 for conditioning the signal from VCO 202. In selected embodiments, filter bank 203 may be a low pass filter to attenuate the harmonics that interfere with measurement of the signal power of test set 101. From filter bank 203, the test signal enters power amp 205 whose output is sampled in automatic level control (ALC) 206 loop. ALC 206 operates to condition the output from power amp 205. Therefore, the signal output from power amp 205 will generally be produced at a single, constant level, such as 0 dBm, 10 dBm, or the like. $R_{out}$ is the output impedance connecting to the test signal communication line. The value of $R_{out}$ is usually selected to match the impedance of the system for purposes of signal transmission. Therefore, RF input 105 will see a single, constant level test signal transmitted from calibration pod 100.

Figure 3:
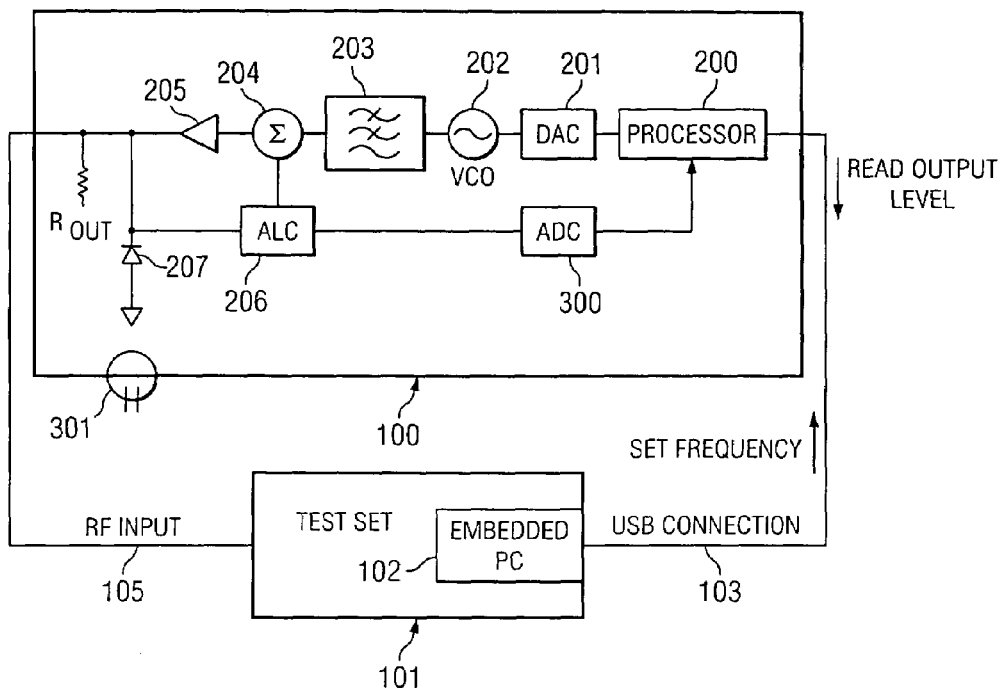
FIG. 3 is an additional embodiment of a calibration pod configured according to the teachings herein.

FIG. 3 is an additional embodiment of calibration pod 100 configured according to the teachings herein. Instead of verifying test set 101 using a known or presumed single signal level, the embodiment of calibration pod 100 depicted in FIG. 3 physically measures the signal level exiting ALC 206 to be used by the verification application. In order for test set 101 to effectively process the test/verification data, analog-to-digital converter 300 (ADC) converts the analog output signals from ALC 206 into digital data and transmits that information to processor 200. Processor 200 may then communicate the data back to embedded PC 102 for use in the executing verification software. The verification application receives the measurement of the actual output level being transmitted from power amp 205 and may use that information to compare with the signal level measurements obtained from test set 101.

The embodiment of calibration pod 100 illustrated in FIG. 3 also includes power connection 301 for providing power in excess of what can be supplied by USB connection 103. Some applications may need signal levels that exceed the levels achieved with power supplied directly from USB connection 103. In such implementations, power connection 301 may be included to reach the desired output levels.

Figure 4:
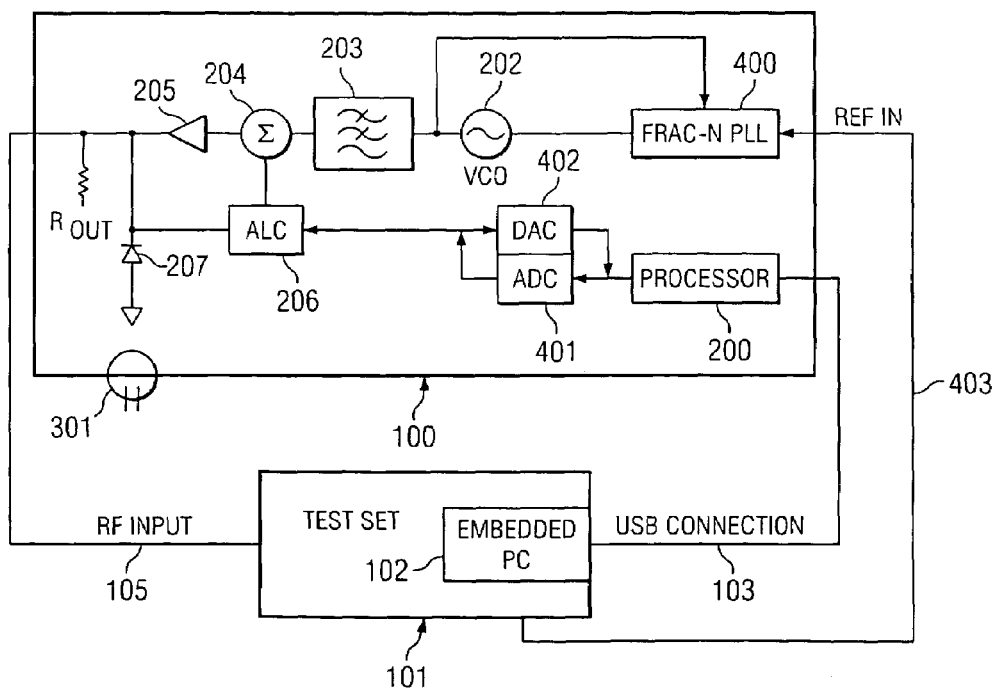
FIG. 4 is a block diagram illustrating an additional embodiment of a calibration pod configured for multi-level verification.

While the embodiment of calibration pod 100 depicted in FIG. 3 allows for the actual measurement of signal level to be performed on ALC 206 output, the embodiment of pod 100 shown in FIG. 4 includes elements allowing embedded PC 102 to control or vary the signal level set by ALC 206. FIG. 4 is a block diagram illustrating an additional embodiment of calibration pod 100 configured for multi-level verification. To accomplish this multi-level test signal generation, DAC 402 is added to the communication line of ADC 401. Therefore, ADC 401 reads the actual output level of ALC 206 and communicates that value back to embedded PC 102 through processor 200 and DAC 402 transmits control signals to ALC 206 to vary the desired output signal level for power amp 205. The verification logic running on embedded PC 102 may send signals to processor 200 detailing the signal level desired for testing. Processor 200 then transmits those control signals to DAC 402, which converts the signals to analog control signals for changing the output of ALC 206. Therefore, calibration pod 100 of FIG. 3 cannot only read the actual output signal level of power amp 205, but may also control what level to set.

The embodiment of calibration pod 100 shown in FIG. 4 may also be configured to operate with embodiments of test set 101 that are extremely accurate and sensitive. Verifying such accurate and sensitive equipment generally requires using a more accurate and sensitive test signals. The range of signal frequencies that may be produced is generally limited to the VCO used. A VCO that can produce a wide range of frequencies typically has a larger gap between frequency steps. In order to produce a finer step size with an ordinary VCO the range of available frequencies generally decreases. Therefore, to obtain a smaller resolution of frequencies using only a VCO, a trade-off in overall signal range is typically accepted.

A means for producing a wide range of frequencies having a finer resolution in step size is to implement a fractional-n phase locked loop (PLL). Calibration pod 100, as shown in FIG. 4, incorporates fractional-n PLL 400 to create a finer resolution step size of the reference signals generated by VCO 202. A test reference generated at test set 101 is communicated to fractional-n PLL 400 to establish the resolution size of the test signal generated by VCO 202. This test reference enters calibration pod 100 at RefIN 403. Using the test reference from test set 101 and the output signal of VCO 202, the resolution of the output signal may be selected at a much finer step size than that produced by VCO 202 alone. The finer step size allows calibration pod 100 to transmit test signals at a wider variety of frequencies over a larger frequency band. Therefore, the more accurate and sensitive test equipment may be verified over a wide and varied band of frequencies.

An additional consideration that is generally made in designing calibration equipment is the temperature stability of the internal components. The components of the ALC, in addition to any possible diode detector positioned to detect the expected signal level output of the calibration pod may be subject to temperature drift. Temperature drift is the variation in signal produced across different temperatures of the equipment. When moving a calibration pod from test site to test site, the components may vary in temperature as the power is applied and then stopped repeatedly. This variation in temperature may prevent the generated stimulus signal from remaining level at the different test points. Calibration carts would typically need to be re-calibrated when the temperature varied by a certain degree. One method to overcome the temperature drift is to include an ovenizing circuit to quickly heat the temperature sensitive equipment to a constant, optimal temperature.

Figure 5:
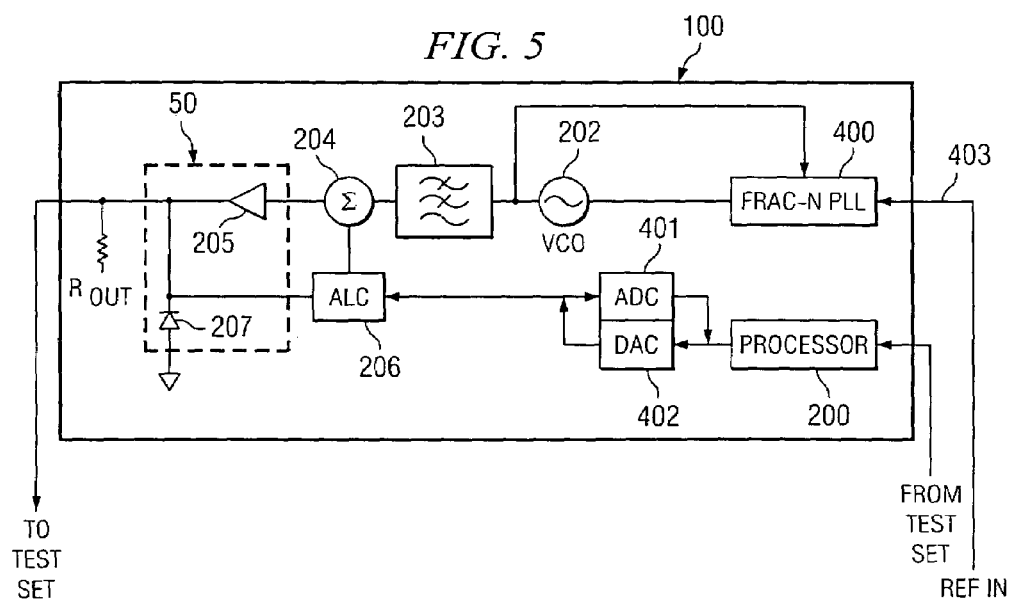
FIG. 5 is a block diagram illustrating an additional embodiment of a calibration pod configured for multi-level verifications.

FIG. 5 is a block diagram illustrating an additional embodiment of calibration pod 100 configured for multilevel verification. As indicated in FIG. 5, power amplifier 205 and diode detector 207 are placed within the coverage of ovenizer 50. Ovenizer 50 may comprise a simple resistor network, or some other type of heating element that may quickly heat the components of diode detector 207 and power amplifier 205 to a stable, optimum temperature.

Therefore, when a user plugs calibration pod 100 into a power source, ovenizer 50 quickly heats diode detector 207 and power amplifier 205 to a stable, optimum temperature. Once the heating has occurred, which may be a very short amount of time, the user is prompted that the calibration pod is ready for use.

In various additional embodiments of calibration pod 100, it is desirable to provide ovenizer 50 in such a manner to obviate the need to re-calibrate across the temperature flux of the system. In very accurate and sensitive test systems it may be desirable for a calibration pod to have its full accuracy over 25 degrees Celcius (+/−15 degrees) without requiring a re-calculation of calibration pod 100 over this design temperature range. For this reason embodiments of calibration pod 100 may ovenize diode detector 207 and ALC power amplifier 205 which may keep calibration pod 100 small and compact.

Although the present invention and its advantages have been described in detail, it should be understood that various changes, substitutions and alterations can be made herein without departing from the invention as defined by the appended claims. Moreover, the scope of the present application is not intended to be limited to the particular embodiments of the process, machine, manufacture, composition of matter, means, methods and steps described in the specification. As one will readily appreciate from the disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A portable calibration unit for calibrating test equipment comprising:
    a communication interface for connecting to a computer embedded within said test equipment;
    a variable signal source for producing a test signal;
    a processor in communication with said computer for controlling said variable signal source; and
    a test interface for communicating said test signal to said test equipment.

2. The portable calibration unit of claim 1 further comprising:
    a digital to analog converter (DAC) in communication with said processor, said DAC converting control signals received from said computer for controlling said variable signal source.

3. The portable calibration unit of claim 2 further comprising:
    a memory within said computer for storing a computer program for directing the generation of said control signals.

4. The portable calibration unit of claim 1 further comprising:
    a filter in communication with said variable signal source for filtering harmonics of said test signal outside of a desired test range.

5. The portable calibration unit of claim 1 further comprising:
    a signal conditioning circuit for conditioning said test signal communicated from said test interface.

6. The portable calibration unit of claim 5 wherein said signal conditioning circuit comprises:
    a power amplifier;

a diode detector; and a level controlling circuit for maintaining a consistent level of said test signal.

7. The portable calibration unit of claim 5 further comprising:

an analog to digital converter (ADC) in communication with said signal conditioning circuit and said processor, said ADC for providing information on said test signal to said processor, wherein said processor communicates said information to said computer.

8. The portable calibration unit of claim 7 further comprising:

a DAC for converting signals received from said processor to control an output of said conditioning circuit, wherein said processor receives said signals from said computer.

9. The portable calibration unit of claim 5 further comprising:

an ovenizer to heat selected elements of said portable calibration unit.

10. The portable calibration unit of claim 1 further comprising:

a fractional-n phase locked loop (PLL) in communication with said variable signal source to decrease a step-size of said test signal.

11. The portable calibration unit of claim 1 wherein power for said unit is supplied by at least one of:

said test equipment;

a battery; and an external power connector.

12. A method for portably calibrating a test system comprising:

establishing a communication link between a calibration pod and a personal computer (PC) embedded within said test system;

generating a test signal within said calibration pod responsive to a digital signal received from said PC; and transmitting said test signal to a test subject of said test system.

13. The method of claim 12 further comprising:

converting said digital signal into an analog signal for said calibration pod to generate said test signal.

14. The method of claim 12 further comprising:

filtering harmonics from said test signal prior to said transmitting.

15. The method of claim 12 further comprising:

conditioning said test signal through at least:

a power amplifier; and an automatic level control (ALC).

16. The method of claim 15 further comprising:

measuring an analog value of said test signal exiting said ALC;

converting said analog value into a digital value; and transmitting said digital value to said PC.

17. The method of claim 16 further comprising:

receiving at said calibration pod digital control signals from said PC for controlling an output of said calibration pod;

converting said digital control signals into analog control signals; and transmitting said analog control signals to said ALC.

18. The method of claim 12 further comprising:

heating selected elements of said calibration pod prior to said generating.

19. A system for calibrating test equipment comprising:

a calibration unit having an interface for connecting to a personal computer (PC) embedded in said test equipment;

a processor within said calibration unit, said processor configured to receive digital control signals from said PC;

a signal source for generating a test signal responsive to said digital control signals; and a test connection for connecting said calibration unit to said test equipment, wherein said test signal is transmitted to said test equipment using said test connection.

20. The system of claim 19 further comprising:

memory within said PC storing one or more calibration applications, said one or more calibration applications prompting selected ones of said digital control signals.

21. The system of claim 19 further comprising:

means for converting said digital control signals into analog control signals for controlling said signal source.

22. The system of claim 19 further comprising:

a low pass filter for filtering out harmonics of said test signal.

23. The system of claim 19 further comprising:

an amplifier for conditioning said test signal;

a diode detector; and an automatic level controller (ALC), for controlling a level of said test signal.

24. The system of claim 23 further comprising:

means for heating at least one of:

said amplifier;

said diode detector; and said ALC.

25. The system of claim 19 further comprising:

means for reading a value of said test signal at said calibration unit; and means for forwarding said value to said PC.

26. The system of claim 19 further comprising:

means for decreasing a step size in signals generated by said signal source.

27. The system of claim 19 wherein power for said calibration unit is provided by at least one of:

said test equipment;

an alternating current (AC) source; and a direct current (DC) source.

* * * * *